United States Patent
Komiyama

(10) Patent No.: US 8,693,510 B2
(45) Date of Patent: Apr. 8, 2014

(54) OPTICAL TRANSMITTER AND OPTICAL TRANSMISSION APPARATUS

(75) Inventor: Manabu Komiyama, Kawasaki (JP)

(73) Assignee: Fujitsu Optical Components Limited, Kawasaki (JP)

( * ) Notice: Subject to any disclaimer, the term of this patent is extended or adjusted under 35 U.S.C. 154(b) by 116 days.

(21) Appl. No.: 13/406,708

(22) Filed: Feb. 28, 2012

(65) Prior Publication Data

US 2012/0269508 A1    Oct. 25, 2012

(30) Foreign Application Priority Data

Apr. 22, 2011    (JP) ................. 2011-096502

(51) Int. Cl.
*H01S 3/121*    (2006.01)

(52) U.S. Cl.
USPC ............... 372/15; 372/16; 372/27; 372/34; 372/100; 372/106

(58) Field of Classification Search
USPC ................. 372/15–16, 27, 34, 106
See application file for complete search history.

(56) References Cited

U.S. PATENT DOCUMENTS

| | | | |
|---|---|---|---|
| 4,686,485 A * | 8/1987 | Goldberg et al. | 359/340 |
| 7,492,798 B2 | 2/2009 | Deng et al. | |
| 2001/0024462 A1 | 9/2001 | Nakahara et al. | |
| 2008/0166085 A1 * | 7/2008 | Ito et al. | 385/11 |

FOREIGN PATENT DOCUMENTS

| | | |
|---|---|---|
| JP | 55-080021 | 6/1980 |
| JP | 56-133758 | 10/1981 |
| JP | 2001-94200 | 4/2001 |
| JP | 2002-43671 | 2/2002 |
| JP | 2005-72197 | 3/2005 |

* cited by examiner

*Primary Examiner* — Dung Nguyen
(74) *Attorney, Agent, or Firm* — Staas & Halsey LLP

(57) ABSTRACT

An optical transmitter includes a laser configured to emit light, a power of the light increasing with temperature decreasing, a Faraday rotator configured to rotate a polarization direction of the light in accordance with the temperature, and a first polarizer that has a principal axis inclined at a given angle and inputs the light output from the Faraday rotator.

4 Claims, 13 Drawing Sheets

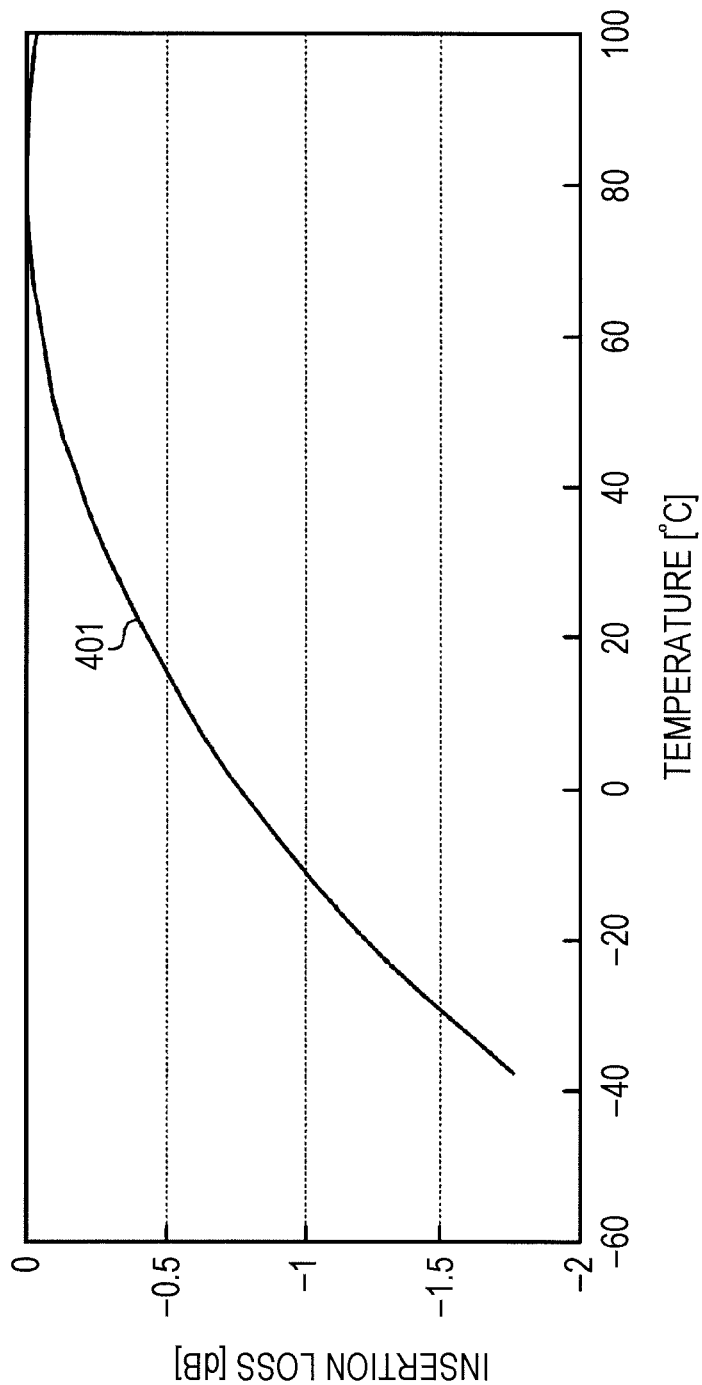

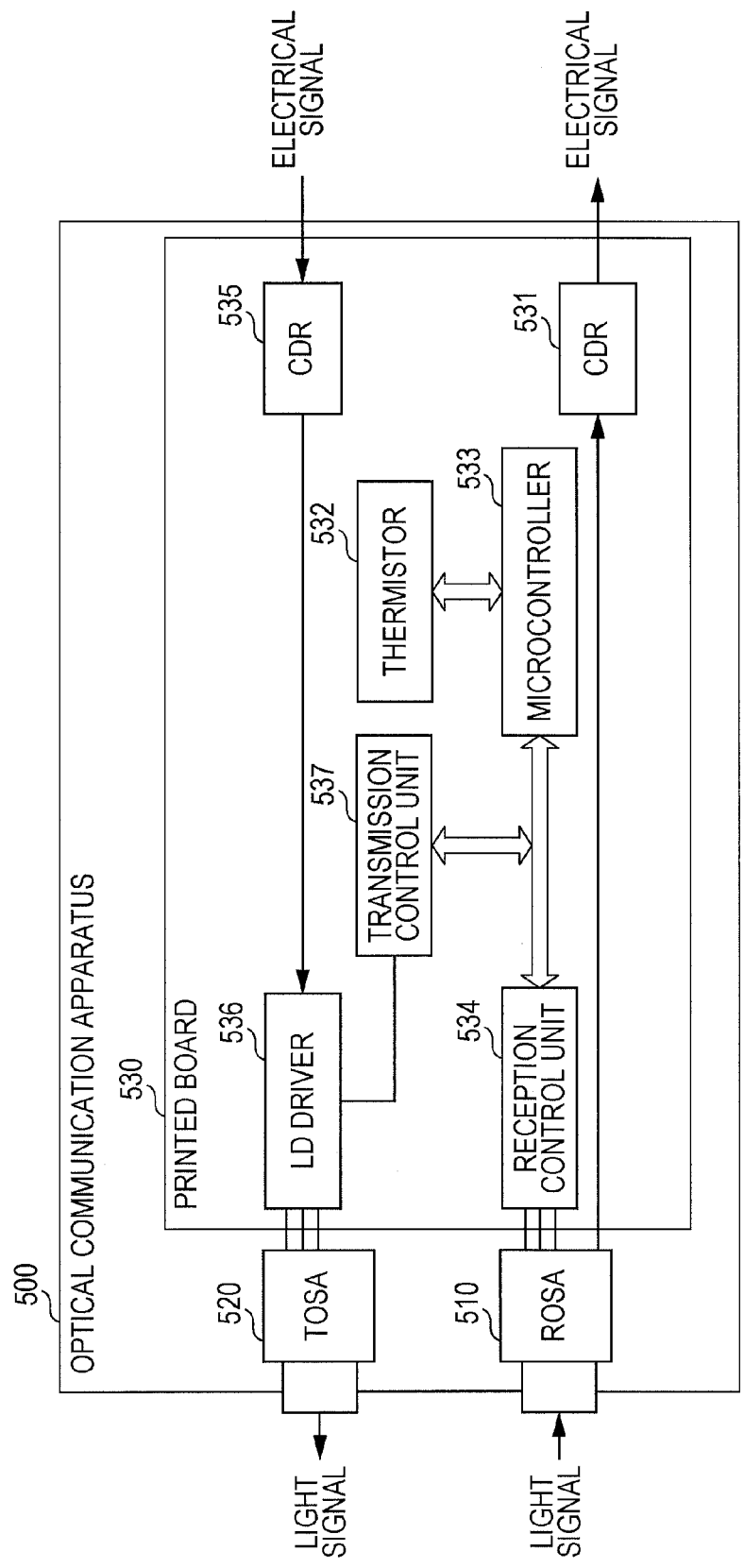

OPTICAL TRANSMITTER AND OPTICAL TRANSMISSION APPARATUS

CROSS-REFERENCE TO RELATED APPLICATION

This application is based upon and claims the benefit of priority of the prior Japanese Patent Application No. 2011-096502, filed on Apr. 22, 2011, the entire contents of which are incorporated herein by reference.

FIELD

The embodiments discussed herein are related to an optical transmitter and an optical transmission apparatus that transmit light.

BACKGROUND

In these years, optical transceivers of approximately 10 Gb/s, such as 10 gigabit small form-factor pluggable (XFP) transceivers are being used in optical transmission apparatuses. For example, in cold districts such as areas around polar regions and in tropical areas around the equator, an optical transmission apparatus can be installed in a building that is not equipped with an air conditioning system or outdoor. In such a case, an optical transceiver whose operation is assured over a wide range of temperatures such as −40° C. to 85° C. is prepared.

In general, the range of temperatures within which the operation of a directly modulated laser (DML) of 10 Gb/s is assured is, for example, −20° C. to 90° C. One of the conditions for expansion of the operating temperature range is to satisfy certain characteristics (the modulation characteristic and the like) of a DML installed in an optical transceiver.

A semiconductor laser module having a temperature regulating function by which the temperature of a DML is kept the same on a thermo-electric cooler (TEC) is known. In addition, a configuration is known in which a heater is provided inside a submount of a semiconductor laser module or outside a semiconductor laser module and the semiconductor laser module is heated when the temperature is low (for example, refer to Japanese Laid-open Patent Publication No. 2001-94200, Japanese Laid-open Patent Publication No. 2005-72197, Japanese Laid-open Patent Publication No. 2002-43671, and U.S. Pat. No. 7,492,798). However, because a semiconductor laser module having a temperature regulating function is expensive, semiconductor laser modules that do not have a temperature regulating function are also used.

The above-described examples of related art, however, have a problem in that the quality of communication of a DML deteriorates at low temperatures. For example, because of a characteristic of a semiconductor laser such as a DML, the ratio of the optical output power to the value of the driving current becomes larger as the temperature decreases. For this reason, if, for example, a DML is used at low temperatures and automatic power control (APC) for causing the optical output power to remain the same is performed, the driving current decreases.

SUMMARY

According to an aspect of the invention, an apparatus includes a laser configured to emit light, a power of the light increasing with temperature decreasing, a Faraday rotator configured to rotate a polarization direction of the light in accordance with the temperature, and a first polarizer that has a principal axis inclined at a given angle and inputs the light output from the Faraday rotator.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a graph illustrating the relationship between the temperature and the insertion loss of the optical isolator.

FIG. 5 is a diagram illustrating an example of the configuration of an optical communication apparatus according to the first embodiment.

DESCRIPTION OF EMBODIMENTS

An optical transmitter and an optical transmission apparatus according to embodiments will be described hereinafter in detail with reference to the accompanying drawings.

First Embodiment

Configuration of Optical Transmitter

Figure 1:
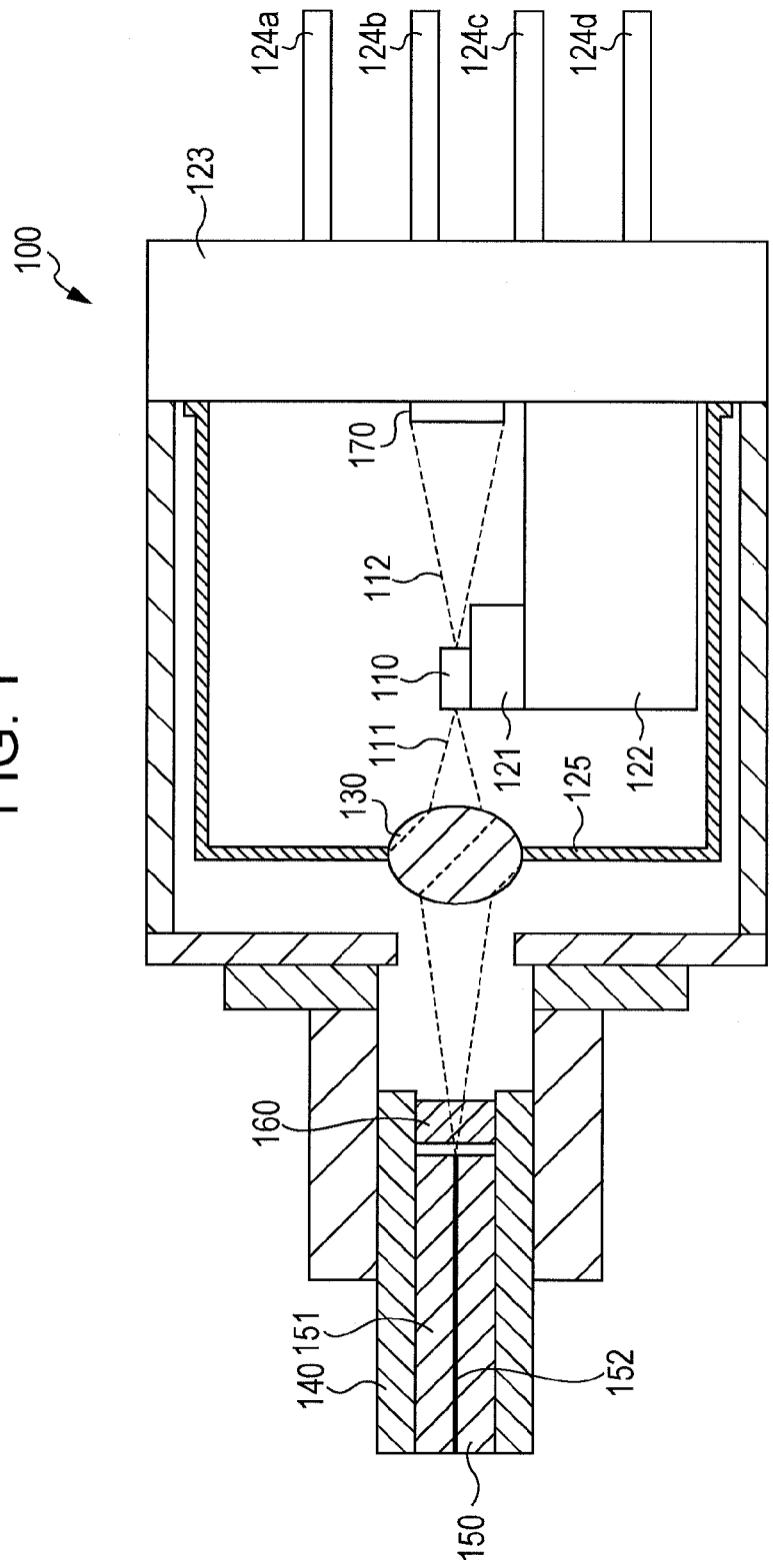
FIG. 1 is a cross-sectional view illustrating an example of the configuration of an optical transmitter according to a first embodiment.

FIG. 1 is a cross-sectional view illustrating an example of the configuration of an optical transmitter according to a first embodiment. As illustrated in FIG. 1, an optical transmitter 100 according to the first embodiment has a semiconductor laser chip 110, a submount 121, a pillar 122, a stem 123, terminals 124a to 124d, a cap 125, a lens 130, a receptacle 140, an optical fiber stub 150, an optical isolator 160, and a monitor photodiode (PD) 170. The optical fiber stub 150 is also referred to as an output port. The optical transmitter 100 may be, for example, a transmitter optical subassembly (TOSA). The optical isolator 160 has the same function as a variable optical attenuator (VOA).

The semiconductor laser chip 110 may be, for example, a DML of 10 Gb/s. The semiconductor laser chip 110 is fixed to the submount 121 by soldering or the like. The submount 121 is fixed to the pillar 122. The pillar 122 is fixed to the stem 123 having a cylindrical shape.

The semiconductor laser chip 110 is electrically connected to at least one of the terminals 124a to 124d through wires formed on surfaces of the submount 121 and the pillar 122, and emits light according to a driving current supplied from the terminal(s) connected thereto.

The power of the semiconductor laser chip 110 for emitting light increases as the temperature decreases (that is, as the temperature of the semiconductor laser chip 110 decreases). For example, the driving current of the semiconductor laser chip 110 is controlled such that a pulse mask characteristic (signal quality) does not become lower than a threshold. In this case, the driving current of the semiconductor laser chip 110 is controlled in such a way as not to decrease even at low temperatures. In addition, because of the characteristics of a semiconductor laser, the ratio of the emission power of the semiconductor laser chip 110 to the driving current increases as the temperature decreases. Therefore, the emission power of the semiconductor laser chip 110 increases as the temperature decreases.

Alternatively, the value of the driving current supplied to the semiconductor laser chip 110 may remain the same over time. In this case, too, the ratio of the emission power of the semiconductor laser chip 110 to the driving current increases as the temperature decreases, and therefore the emission power of the semiconductor laser chip 110 increases as the temperature decreases. In addition, in this case, too, since the power of the driving current does not decreases even at low temperatures, a decrease in the pulse mask characteristic (signal quality) can be suppressed.

In addition, the semiconductor laser chip 110 may be, for example, a distributed feedback (DFB) semiconductor laser having a diffracting grating therein, and have anti-reflection films formed on both end surfaces'thereof. The semiconductor laser chip 110 emits forward output light 111 from the front thereof and backward output light 112 from the back thereof.

The semiconductor laser chip 110 is sealed within a space surrounded by the cap 125 and the stem 123 using dry nitrogen or the like. Therefore, deterioration of the semiconductor laser chip 110 due to changes in humidity and the like can be suppressed. The lens 130 is provided on the cap 125. The lens 130 is provided to optically couple the semiconductor laser chip 110 with the optical fiber stub 150. The lens 130 collects the forward output light 111 emitted from the semiconductor laser chip 110 into an optical fiber 152 in the optical fiber stub 150.

The receptacle 140 is a mechanism for connecting the optical transmitter 100 and an optical connector. The receptacle 140 has the optical fiber stub 150 and the optical isolator 160 therein. In the optical fiber stub 150 (an output unit), the optical fiber 152 is inserted into a through hole provided in a ferrule 151. The ferrule 151 may be formed, for example, by a ceramic such as zirconia. The optical fiber 152 may be formed, for example, by silica glass or the like. The forward output light 111 collected by the lens 130 is incident into the optical fiber 152. The optical fiber 152 lets the incident light pass therethrough and outputs the incident light.

The optical isolator 160 is provided between the lens 130 and the optical fiber stub 150 and optically couples the lens 130 with the optical fiber stub 150. The optical isolator 160 lets the forward output light 111 emitted from the lens 130 toward the optical fiber stub 150 pass therethrough. On the other hand, the optical isolator 160 blocks light reflected from the optical fiber stub 150 toward the lens 130 (for example, refer to FIGS. 3A to 3C). Therefore, the characteristics of the semiconductor laser chip 110 may avoid becoming unstable because of the reflected light.

The characteristics of the optical isolator 160 are adjusted such that the optical loss of the light emitted from the semiconductor laser chip 110 toward the optical fiber stub 150 increases as the temperature decreases within an operating temperature range (for example, refer to FIG. 4). The operating temperature range is, for example, a range of temperature within which the operation of the optical transmitter 100 is assured.

The monitor PD 170 is provided on a surface of the stem 123 facing the semiconductor laser chip 110, and receives the backward output light 112 emitted from the back of the semiconductor laser chip 110. The monitor PD 170 monitors relative intensity of the received backward output light 112, and outputs a result of the monitoring to the outside of the optical transmitter 100 through at least one of the terminals 124a to 124d. Therefore, the emission state of the semiconductor laser chip 110 may be monitored by a circuit provided outside the optical transmitter 100. However, the optical transmitter 100 may have a configuration from which the monitor PD 170 is omitted.

Temperature Characteristics of Optical Output Power and Pulse Mask Margin

Figure 2A:
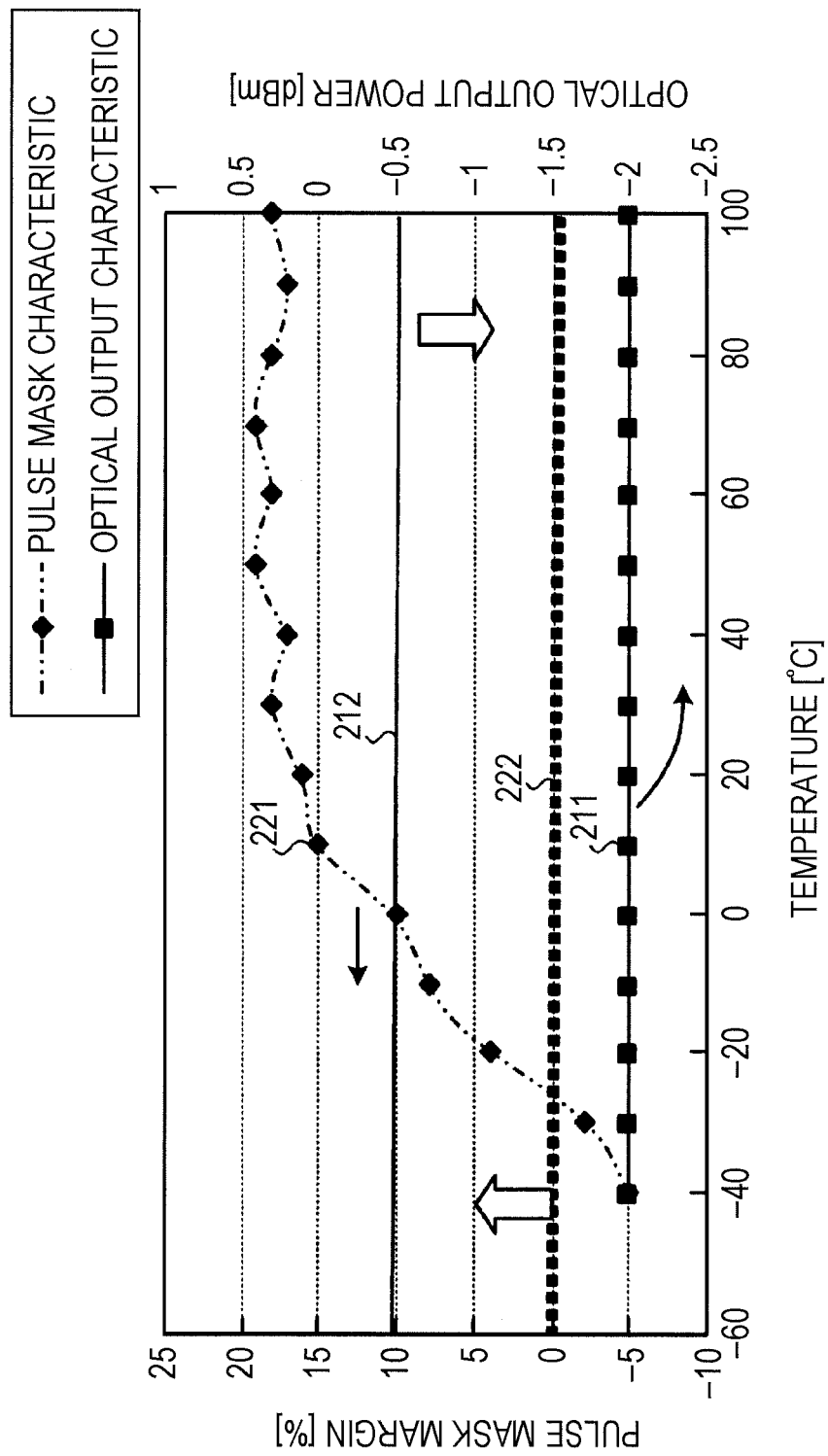
FIG. 2A is a reference diagram illustrating an example of the temperature characteristics of the optical output power and the pulse mask margin of an optical transmitter that performs APC.

FIG. 2A is a reference diagram illustrating an example of the temperature characteristics of the optical output power and the pulse mask margin of an optical transmitter that performs APC. In FIG. 2A, the horizontal axis represents the temperature [° C.] of the optical transmitter 100 (semiconductor laser chip 110). The left-hand vertical axis represents the pulse mask margin [%] of the light output from the optical transmitter 100. The right-hand vertical axis represents the optical output power [dBm] of the optical transmitter 100.

An optical output characteristic 211 indicates the temperature characteristic of the optical output power of the optical transmitter 100. A threshold 212 indicates a threshold (upper limit) of the optical output power of the optical transmitter 100 beyond which the standard is not complied with. A pulse mask characteristic 221 indicates the temperature characteristic of the pulse mask margin of the light output from the optical transmitter 100. A threshold 222 indicates a threshold (lower limit) of the pulse mask margin of the light output from the optical transmitter 100 beyond which the standard is not complied with.

FIG. 2A illustrates the characteristics at a time when the APC is performed by which the driving current is controlled such that the optical output power of the optical transmitter 100 remains the same over time and when the insertion loss of the optical isolator 160 is supposed to remain the same regardless of the temperature. If the APC is assumed to be performed in the optical transmitter 100, the optical output power of the optical transmitter 100 remains substantially the same regardless of the temperature, as illustrated by the optical output characteristic 211 in FIG. 2A. On the other hand, as illustrated by the pulse mask characteristic 221 in FIG. 2A, the pulse mask margin of the light output from the optical transmitter 100 decreases in accordance with a decrease in the driving current caused by the APC at low temperatures. At temperatures equal to or lower than −30° C., the pulse mask margin of the light output from the optical transmitter 100 is below the threshold 222 and the standard is not complied with.

In order to improve the pulse mask margin of the light output from the optical transmitter 100, for example, the relaxation oscillation frequency of the semiconductor laser chip 110 is increased. The relaxation oscillation frequency fr of the semiconductor laser chip 110 can be expressed by the following expression (1) or (2). In the following expression (1) or (2), "SQRT(X)" denotes the square root of X. "α" and "β" are constants. "I" denotes the driving current of the semiconductor laser chip 110. "Ith" denotes the threshold current of the semiconductor laser chip 110. "Po" denotes the optical output power of the semiconductor laser chip 110.

$$fr \propto \alpha \times SQRT(I-Ith) \quad (1)$$

$$fr \propto \beta \times SQRT(Po) \quad (2)$$

That is, in order to improve the pulse mask margin of the light output from the optical transmitter 100 at low temperatures, the driving current I at low temperatures may be increased or the optical output power Po of the forward output light 111 of the semiconductor laser chip 110 at low temperatures may be increased.

Figure 2B:
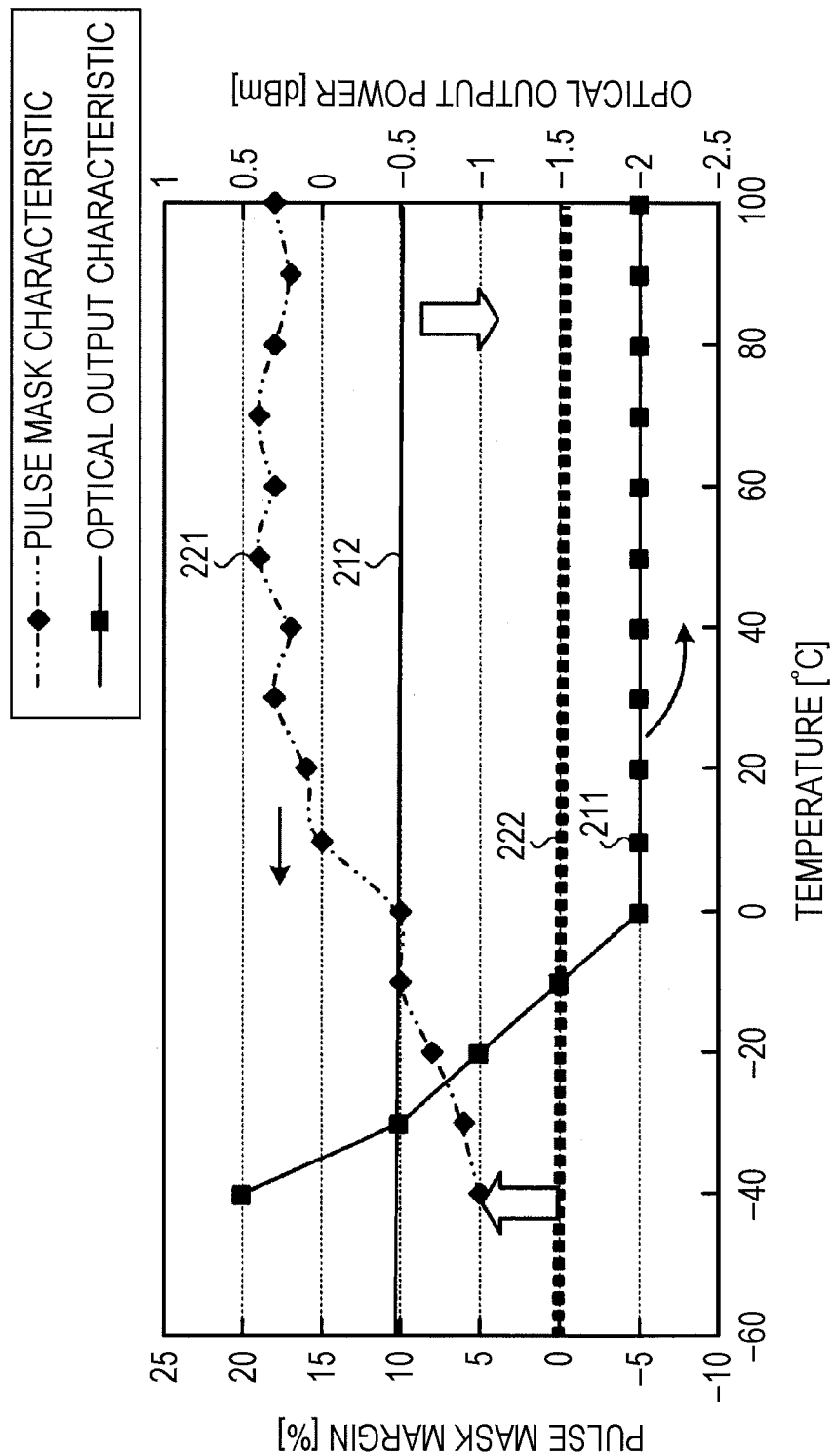
FIG. 2B is a reference diagram illustrating an example of the temperature characteristics of the optical output power and the pulse mask margin of an optical transmitter that performs control based on the pulse mask margin.

FIG. 2B is a reference diagram illustrating an example of the temperature characteristics of the optical output power and the pulse mask margin of an optical transmitter that performs control based on the pulse mask margin. In FIG. 2B, the same reference numerals are given to the same elements as those illustrated in FIG. 2A, and therefore description of those elements is omitted. FIG. 2B illustrates the characteristics at a time when the driving current is controlled such that the pulse mask margin of the light output from the optical transmitter 100 does not become lower than the threshold 222 and when the insertion loss of the optical isolator 160 is supposed to remain the same regardless of the temperature.

In this case, in order to cause the pulse mask margin of the light output from the optical transmitter 100 not to become lower than the threshold 222 even at low temperatures, the driving current at low temperatures is larger than that in the case illustrated in FIG. 2A. Therefore, the optical output power of the optical transmitter 100 at low temperatures is also larger than that in the case illustrated in FIG. 2A. At temperatures equal to or lower than −30° C., for example, the optical output power of the optical transmitter 100 exceeds the threshold 212 and the standard is not complied with.

Figure 2C:
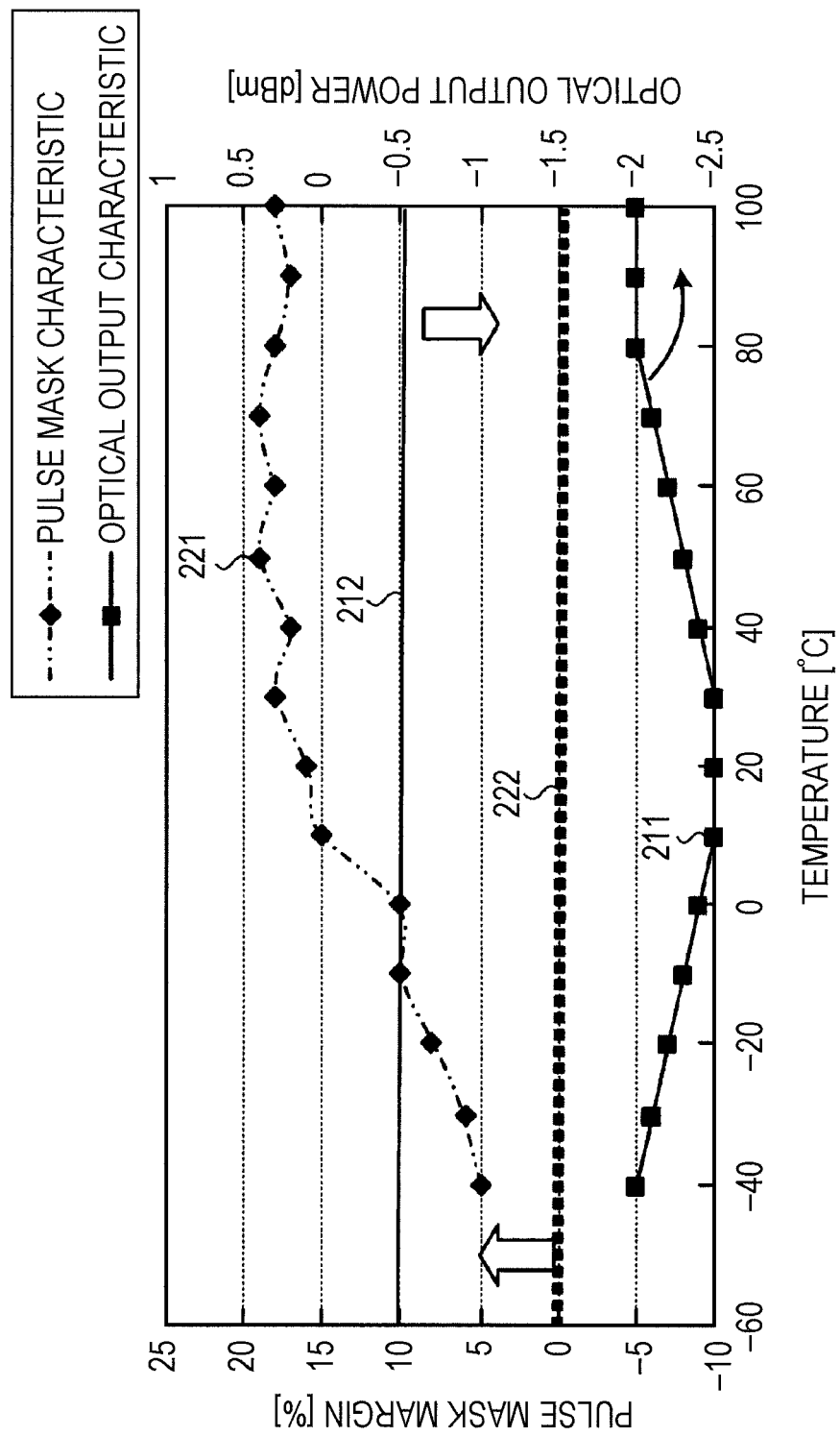
FIG. 2C is a diagram illustrating an example of the temperature characteristics of the optical output power and the pulse mask margin of the optical transmitter according to the first embodiment.

FIG. 2C is a diagram illustrating an example of the temperature characteristics of the optical output power and the pulse mask margin of the optical transmitter according to the first embodiment. In FIG. 2C, the same reference numerals are given to the same elements as those illustrated in FIG. 2A, and therefore description of those elements is omitted. As with the optical transmitter 100 illustrated in FIG. 1, FIG. 2C illustrates, for example, the characteristics at a time when the driving current is controlled such that the pulse mask margin of the light output from the optical transmitter 100 does not become lower than the threshold 222 and when the insertion loss of the optical isolator 160 increases as the temperature decreases.

In this case, the emission power of the semiconductor laser chip 110 at low temperatures increases, but because the insertion loss of the optical isolator 160 also increases at low temperatures, an increase in the power of the light output from the optical transmitter 100 at low temperatures can be suppressed. For example, as illustrated in FIG. 2C, it is possible to cause the pulse mask margin of the light output from the optical transmitter 100 not to become lower than the threshold 222, while causing the optical output power of the optical transmitter 100 not to become higher than the threshold 212. Therefore, distortion of the waveform of the output light and excess of the power of the output light can be suppressed even at low temperatures. Thus, the quality of communication can be improved.

Example of Configuration of Optical Isolator

Figure 3A:
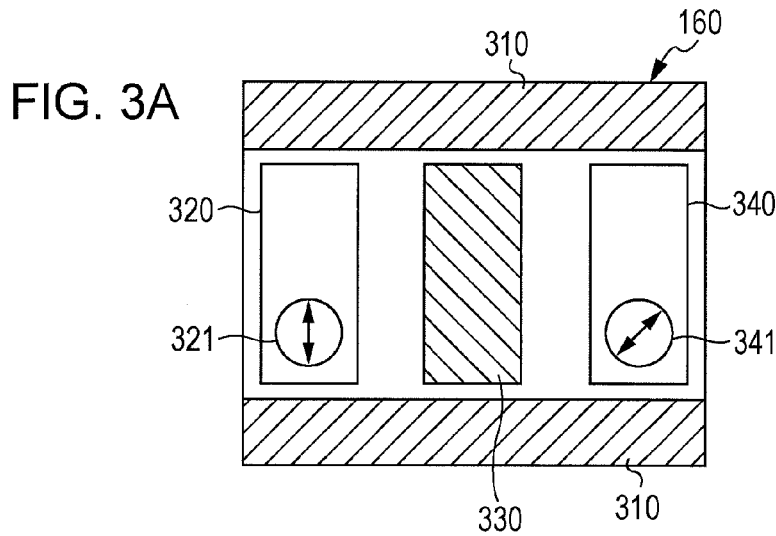
FIG. 3A is a diagram illustrating an example of the configuration of an optical isolator.

FIG. 3A is a diagram illustrating an example of the configuration of the optical isolator 160. As illustrated in FIG. 3A, the optical isolator 160 has a tubular magnet 310, a polarizer 320, a Faraday rotator 330, and a polarizer 340. The tubular magnet 310 is a magnet having a tubular shape. The polarizer 320, the Faraday rotator 330, and the polarizer 340 are arranged in series with one another in the tubular magnet 310. The tubular magnet 310 magnetizes the Faraday rotator 330.

The polarizer 320 is a first polarizer that lets linearly polarized light in a given direction (a polarization direction 321) pass therethrough and blocks polarized light in directions other than the given direction. The polarization direction 321 of the polarizer 320 will be described as a reference direction of 0° hereinafter. The polarizer 340 is a second polarizer arranged at an angle of 45° (a polarization direction 341) relative to the polarizer 320. That is, the polarizer 340 lets linearly polarized light at an angle of 45° pass therethrough and blocks polarized light at angles other than 45°. However a power of light can be controlled in accordance with a temperature change, the above angle of 45° may be a predetermined angle.

The Faraday rotator 330 is provided between the polarizer 320 and the polarizer 340. The Faraday rotator 330 rotates the polarization direction of light that passes therethrough by an angle according to the temperature. Here, suppose that the Faraday rotator 330 rotates the polarization direction by 45°. The Faraday rotator 330 can be realized, for example, by a garnet single crystal film.

Figure 3B:
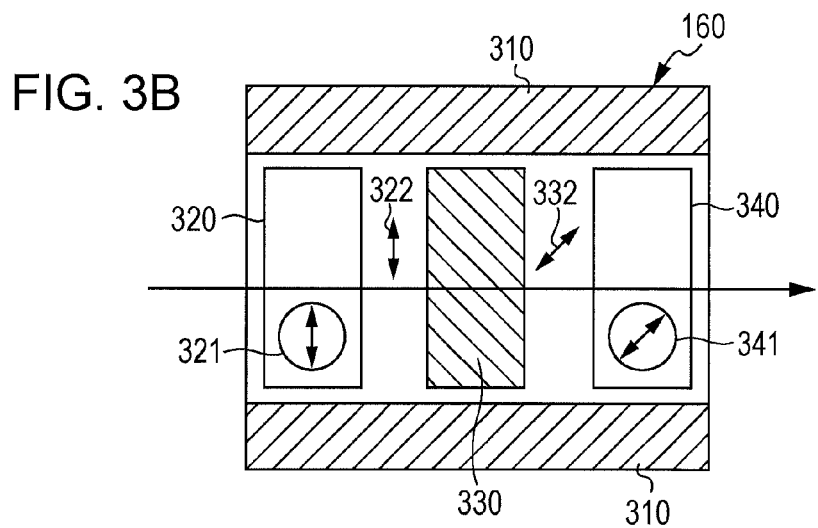
FIG. 3B is a diagram illustrating light incident to the optical isolator in a forward direction.

FIG. 3B is a diagram illustrating light incident to the optical isolator 160 in a forward direction. In FIG. 3B, the same reference numerals are given to the same components as those illustrated in FIG. 3A, and therefore description of those components is omitted. As illustrated in FIG. 3B, only linearly polarized light at an angle of 0° (a polarization direction 322) in light incident from a previous stage (that is, in the forward direction) of the optical isolator 160 passes through the polarizer 320, and is incident to the Faraday rotator 330.

Therefore, light emitted toward the polarizer 340 whose polarization direction has been rotated by the Faraday rotator 330 is linearly polarized light at an angle of 45° (a polarization direction 332). Since the polarizer 340 lets linearly polarized light at an angle of 45° pass therethrough, the light emitted from the Faraday rotator 330 passes through the polarizer 340 and is emitted to a subsequent stage of the optical isolator 160. However a power of light can be controlled in accordance with a temperature change, the above angle of 45° may be a predetermined angle.

Figure 3C:
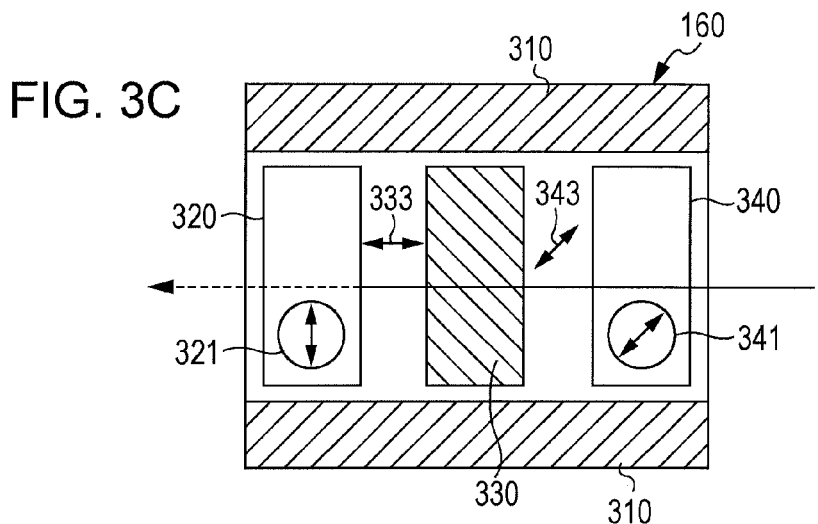
FIG. 3C is a diagram illustrating light incident to the optical isolator in a backward direction.

FIG. 3C is a diagram illustrating light incident to the optical isolator 160 in a backward direction. In FIG. 3C, the same reference numerals are given to the same components as those illustrated in FIG. 3A, and therefore description of those components is omitted. As illustrated in FIG. 3C, only linearly polarized light at an angle of 45° (a polarization direction 343) in light incident from the subsequent stage (that is, in the backward direction) of the optical isolator 160 passes through the polarizer 340, and is incident to the Faraday rotator 330.

Therefore, light emitted toward the polarizer 320 whose polarization direction has been rotated by the Faraday rotator 330 by 45° is linearly polarized light at an angle of 90° (a polarization direction 333). Since the polarizer 320 lets only linearly polarized light at an angle of 0° pass therethrough, the light emitted from the Faraday rotator 330 is blocked by the polarizer 320 and is not emitted to the previous stage of the optical isolator 160.

As illustrated in FIGS. 3B and 3C, the light incident to the optical isolator 160 in the forward direction can pass through the optical isolator 160, while the light incident to the optical isolator 160 in the backward direction can be blocked by the optical isolator 160. Although the Faraday rotator 330 rotates the polarization direction by 45° in the above description, the Faraday rotator 330 has a characteristic that the amount of rotation of the polarization direction changes in accordance with the temperature.

Therefore, a deviation according to the temperature is caused between the polarization direction of light that has passed through the polarizer 320 and the Faraday rotator 330 and the polarization direction of the polarizer 340. For this reason, the percentage of light that passes through the polarizer 340 in the forward direction changes in accordance with the temperature. Accordingly, the insertion loss of the optical isolator 160 changes in accordance with the temperature.

FIG. 4 is a graph illustrating the relationship between the temperature and the insertion loss of the optical isolator 160. In FIG. 4, the horizontal axis represents the temperature [° C.] of the optical isolator 160. The vertical axis represents the insertion loss [dB] of the optical isolator 160. An insertion loss characteristic 401 is the temperature characteristic of the insertion loss of the optical isolator 160.

As illustrated by the insertion loss characteristic 401, the insertion loss of the optical isolator 160 is arranged to be minimum on the high-temperature side of the operating temperature range (for example, −40° C. to 80° C.) of the optical transmitter 100. At this time, the angle by which the polarization direction is rotated by the Faraday rotator 330 becomes closer to 45° (a certain angle) as the temperature increases, and the difference from 45° becomes larger as the temperature decreases. Therefore, it is possible to cause the insertion loss of the optical isolator 160 to increase as the temperature decreases within the operating temperature range of the optical transmitter 100.

The insertion loss characteristic 401 may be adjusted by adjusting the relative angle between the polarizer 320 and the polarizer 340. In addition, the insertion loss characteristic 401 may be adjusted by selecting the material of the Faraday rotator 330 or the like. For example, during manufacturing of the optical transmitter 100, the optical output power of the optical transmitter 100 is monitored while changing the temperature of the semiconductor laser chip 110, and the insertion loss characteristic 401 is adjusted such that the optical output power remains substantially the same regardless of the temperature. In doing so, the optical output power of the optical transmitter 100 may remain substantially the same regardless of the temperature.

Example of Configuration of Optical Communication Apparatus

FIG. 5 is a diagram illustrating an example of an optical communication apparatus according to the first embodiment. An optical communication apparatus 500 illustrated in FIG. 5 has a receiver optical subassembly (ROSA) 510, a TOSA 520, and a printed board 530. The optical communication apparatus 500 is an optical transmission apparatus that transmits light with TOSA 520.

The ROSA 510 is a receiver that includes a PD, that receives light from the outside using the PD, and that outputs an electrical signal that has been subjected to photoelectric conversion to the printed board 530. The TOSA 520 is a transmitter that includes a semiconductor laser and that transmits a light signal to the outside by causing the semiconductor laser to emit light in accordance with a driving current supplied from a laser diode (LD) driver 536. The optical transmitter 100 illustrated in FIG. 1 may be applied to the TOSA 520.

The printed board 530 includes a clock and data recovery (CDR) 531, a thermistor 532, a microcontroller 533, a reception control unit (controller) 534, a CDR 535, the LD driver 536, and a transmission control unit (controller) 537. The CDR 531 regenerates an electrical signal output from the ROSA 510 and outputs the regenerated electrical signal to the outside.

The thermistor 532 is a measuring device that measures ambient temperature. The thermistor 532 outputs temperature information indicating the measured temperature to the microcontroller 533. Here, since the TOSA 520 and the thermistor 532 are stored in the same optical communication apparatus 500, the ambient temperature of the thermistor 532 and the temperature of the semiconductor laser of the TOSA 520 are substantially the same, or related to each other. Therefore, the thermistor 532 may indirectly measure the temperature of the semiconductor laser of the TOSA 520 by measuring the ambient temperature.

The microcontroller 533 is a control circuit incorporated into the optical communication apparatus 500. For example, the microcontroller 533 outputs, to the reception control unit 534, the temperature information output from the thermistor 532. The reception control unit 534 is, for example, a control circuit that controls the reception of light signals performed by the ROSA 510 on the basis of the temperature information output from the microcontroller 533.

The CDR 535 receives an electrical signal from the outside. The CDR 535 regenerates the received electrical signal, and outputs the regenerated electrical signal to the LD driver 536. The LD driver 536 drives the TOSA 520 by supplying, to the TOSA 520, a driving current according to the electrical signal output from the CDR 535. In addition, the LD driver 536 changes the value of the driving current supplied to the TOSA 520 in accordance with the control performed by the transmission control unit 537.

The transmission control unit 537 is a control circuit that controls the transmission of light signals performed by the TOSA 520. For example, the transmission control unit 537 obtains the temperature information output from the microcontroller 533 to the reception control unit 534, and controls the value of the driving current supplied from the LD driver 536 to the TOSA 520 on the basis of the obtained temperature information. Thus, the emission power of the semiconductor laser of the TOSA 520 may be controlled in accordance with the temperature of the semiconductor laser of the TOSA 520.

For example, the optical communication apparatus 500 further includes a memory that stores association information obtained by associating the temperature with the value of the driving current. The transmission control unit 537 obtains, from the association information, the value of the driving current corresponding to the temperature indicated by the obtained temperature information, and controls the value of the driving current supplied by the LD driver 536 such that the value of the driving current becomes the obtained value of the driving current.

The association information is, for example, created in advance and stored in the memory. For example, the temperature of the TOSA 520 is measured by the thermistor 532 while changing the temperature of the TOSA 520. The pulse mask margin of the light output from the TOSA 520 is then monitored at each temperature measured by the thermistor 532 while changing the driving current, and a value of the driving current with which the pulse mask margin exceeds a threshold is determined to be the value of the driving current corresponding to the temperature at that time. Therefore, the association information may be created in which the temperature measured by the thermistor 532 is associated with the value of the driving current with which the pulse mask margin (the quality of a waveform) of the light output from the TOSA 520 satisfies a given condition (for example, equal to or larger than the threshold).

It is to be noted that, for example, the ROSA 510, the CDR 531, the reception control unit 534, and the like may be omitted and the optical communication apparatus 500 may be used as an optical transmission apparatus.

Transmitter According To Modification

Figure 6:
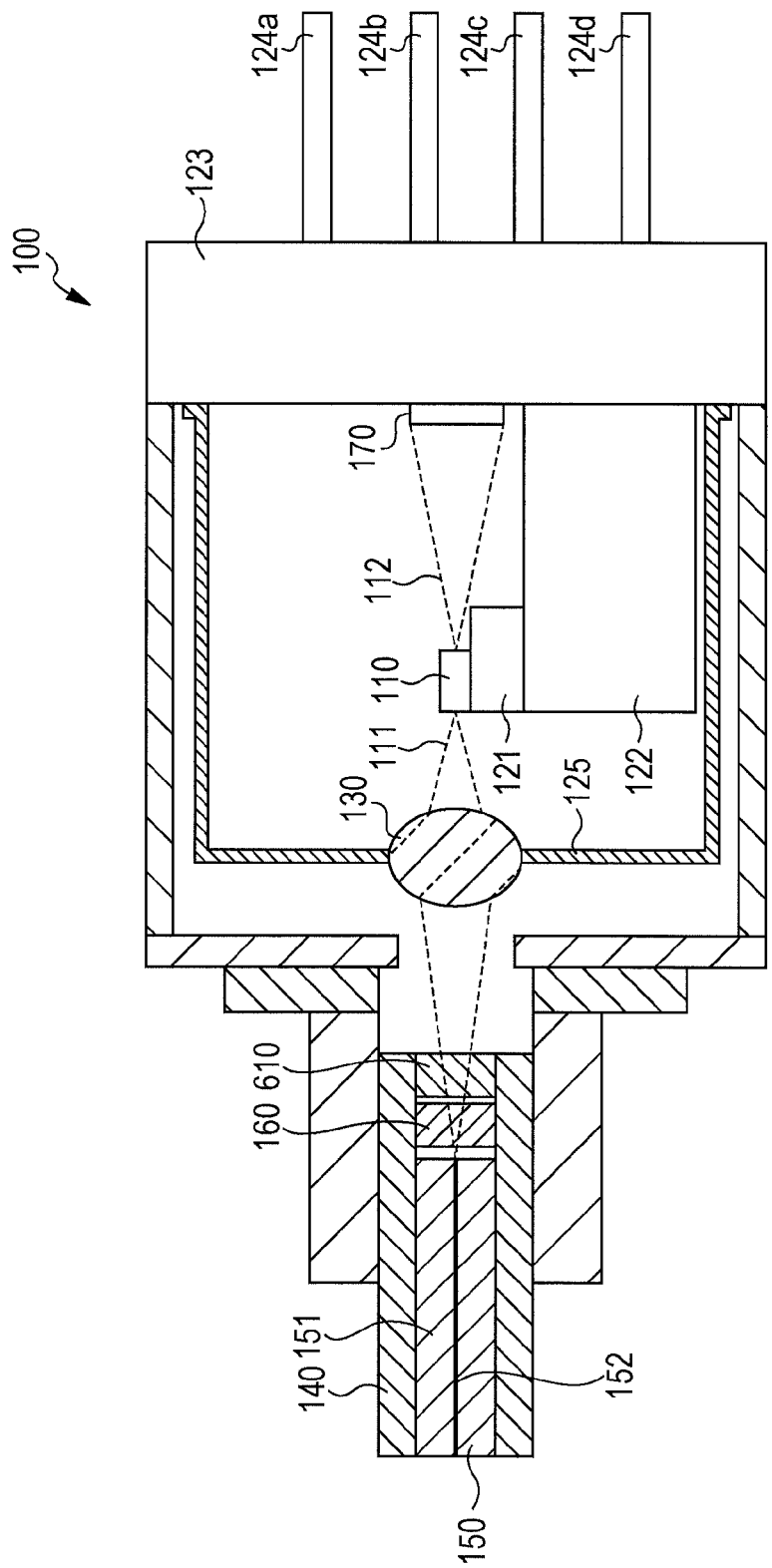
FIG. 6 is a diagram illustrating an optical transmitter, whose first embodiment is illustrated in FIG. 1, according to a modification.

FIG. 6 is a diagram illustrating an optical transmitter, whose first embodiment is illustrated in FIG. 1, according to a modification. In FIG. 6, the same reference numerals are given to the same components as those illustrated in FIG. 1, and description of those components is omitted. As illustrated in FIG. 6, the optical transmitter 100 may have an optical isolator 610 in addition to the configuration illustrated in FIG. 1. The optical isolator 610 is arranged in series with the optical isolator 160 inside the receptacle 140.

The optical isolator 610 lets the forward output light 111 emitted from the lens 130 toward the optical fiber stub 150 pass therethrough. On the other hand, the optical isolator 610 blocks light reflected from the optical fiber stub 150 toward the lens 130. Examples of the configuration of the optical isolator 610 are the same as those illustrated in FIGS. 3A to 3C.

Thus, by providing the plurality of optical isolators, namely the optical isolator 160 and the optical isolator 610, the isolation characteristics for suppressing the reflected light are improved. Therefore, even if the isolation characteristics of the optical isolator 160 decrease in accordance with an increase in the optical loss of the optical isolator 160 at low temperatures, the reflected light of the semiconductor laser chip 110 is suppressed. Accordingly, the characteristics of the semiconductor laser chip 110 may avoid becoming unstable because of the reflected light.

In the insertion loss characteristics obtained by combining the insertion loss characteristics 401 of the optical isolators 160 and 610, the insertion losses may be larger as the temperature decreases. For example, in the insertion loss characteristic 401 of each of the optical isolators 160 and 610, the insertion loss may be larger as the temperature decreases. Alternatively, the insertion loss may be larger as the temperature decreases in the insertion loss characteristic 401 of either the optical isolator 160 or 610, and the insertion loss may remain the same regardless of the temperature in the insertion loss characteristic 401 of the other optical isolator 610 or 160.

As described above, in the optical transmitter 100 according to the first embodiment, the optical isolator 160 whose insertion loss becomes larger as the temperature decreases is provided in a subsequent stage of the semiconductor laser chip 110, whose power for emitting light increases as the temperature decreases. Therefore, an increase in the optical output power of the optical transmitter 100 is suppressed even when the driving current is not decreased at low temperatures.

Since the driving current is not decreased, a decrease in the relaxation oscillation frequency of the semiconductor laser chip 110 can be suppressed, thereby suppressing deterioration of the waveform of the light output from the optical transmitter 100. Even when the driving current is decreased, an increase in the optical output power of the optical transmitter 100 can be suppressed with a small decrease, thereby suppressing deterioration of the waveform of the light output from the optical transmitter 100. In addition, by suppressing an increase in the optical output power of the optical transmitter 100, the optical output power of the optical transmitter 100 can avoid deviating from an optical output standard. Therefore, the quality of communication can be improved even at low temperatures. For this reason, for example, the operating temperature range of the optical transmitter 100 can be expanded.

In addition, for example, even when the driving current of the semiconductor laser chip 110 is controlled such that the pulse mask characteristic does not become lower than the threshold and therefore the driving current becomes large at low temperatures, an increase in the optical output power of the optical transmitter 100 can be suppressed.

According to the optical transmitter 100, by using the optical isolator 160, which has a characteristic that the insertion loss thereof becomes larger as the temperature decreases, the operating temperature range can be expanded without using a heater or the like. Therefore, increases in power consumption and the complexity of control can be avoided. In addition, for example, compared to a configuration in which a VOA is provided and the VOA is controlled in accordance with the temperature, increases in power consumption and the complexity of control can be avoided. In addition, by realizing, using the optical isolator 160, an element whose insertion loss becomes larger as the temperature decreases, the operating temperature range can be expanded without increasing the number of components.

Second Embodiment

Example of Configuration of Transmitter

Figure 7A:
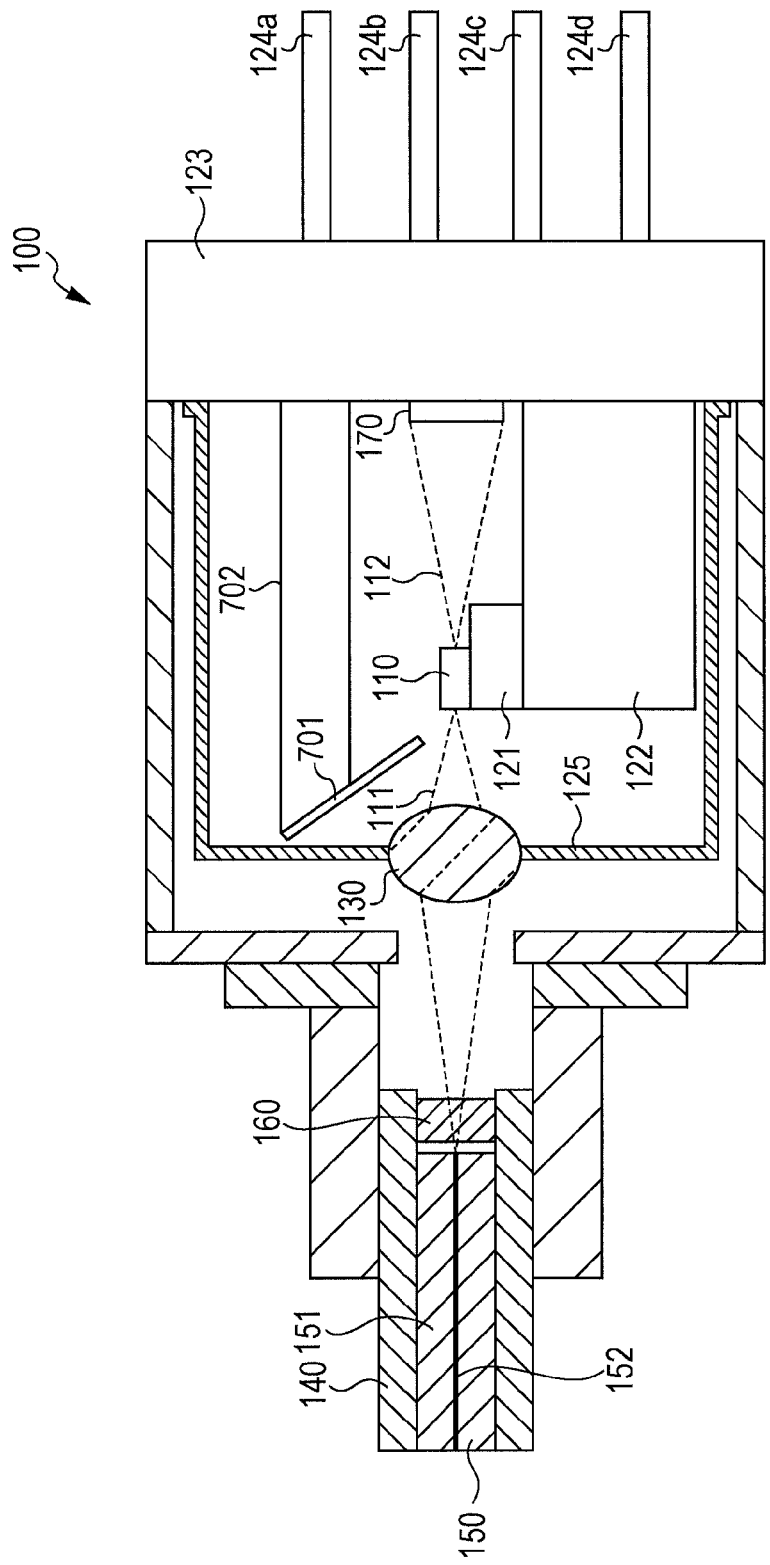
FIG. 7A is a cross-sectional view illustrating an example of the configuration of an optical transmitter according to a second embodiment.

FIG. 7A is a cross-sectional view illustrating an example of the configuration of an optical transmitter according to a second embodiment. In FIG. 7A, the same reference numerals are given to the same components as those illustrated in FIG. 1, and therefore description of those components is omitted. As illustrated in FIG. 7A, an optical transmitter 100 according to the second embodiment has a plate 701 and a pillar 702 in addition to the configuration illustrated in FIG. 1.

The plate 701 is a plate whose amount of bending changes in accordance with the temperature. The plate 701 may be realized, for example, by a bimetal obtained by attaching a plurality of (for example, two) metal plates whose coefficients of thermal expansion are different from one another to one another.

For the bimetal to be used as the plate 701, two metal plates whose coefficients of thermal expansion are different from each other by 10 to 30 ppm are desirably used. As a material of the bimetal having a smaller coefficient of thermal expansion, for example, a Ni—Fe alloy in which the weight percentage of Ni is 36% to 48% may be used. As a material of the bimetal having a larger coefficient of thermal expansion, for example, Cu, Ni, a 70% Cu—Zn alloy, a 70% Ni—Cu alloy, a Ni—Cr—Fe alloy, or a 20% Ni—Mn—Fe alloy may be used. The bimetal is disclosed in some examples of the related art (for example, Japanese Laid-open Patent Publication No. 55-080021 and Japanese Laid-open Patent Publication No. 56-133758).

The plate 701 is adjusted in such a way as to block part of the light emitted from the semiconductor laser chip 110 toward the optical fiber stub 150 by an amount according to the amount of bending thereof. Here, the plate 701 is fixed to the pillar 702 by soldering or the like. The pillar 702 is fixed to the stem 123.

In addition, the plate 701 is adjusted such that the amount of light emitted from the semiconductor laser chip 110 toward the optical fiber stub 150 blocked thereby increases as the temperature decreases. The adjustment of the plate 701 may be made, for example, by changing the coefficient of thermal expansion of each metal plate included in the plate 701, the size (for example, the area or the length), the shape, the position, or the angle of the plate 701, or the like. The total thickness of the bimetal is, for example, preferably about 0.1 to 0.8 mm, and more preferably about 0.1 to 0.5 mm.

As illustrated in FIG. 7A, for example, the plate 701 is substantially flat at ordinary temperatures (for example, room temperature), and adjusted in such a way as not to block the light emitted from the semiconductor laser chip 110 toward the optical fiber stub 150 (the amount of light blocked is zero). In the second embodiment, the insertion loss characteristic 401 of the optical isolator 160 is not limited to a characteristic that the insertion loss of the optical isolator 160 increases as the temperature decreases. For example, the insertion loss characteristic 401 of the optical isolator 160 may be a characteristic that the insertion loss of the optical isolator 160 remains the same regardless of the temperature.

Figure 7B:
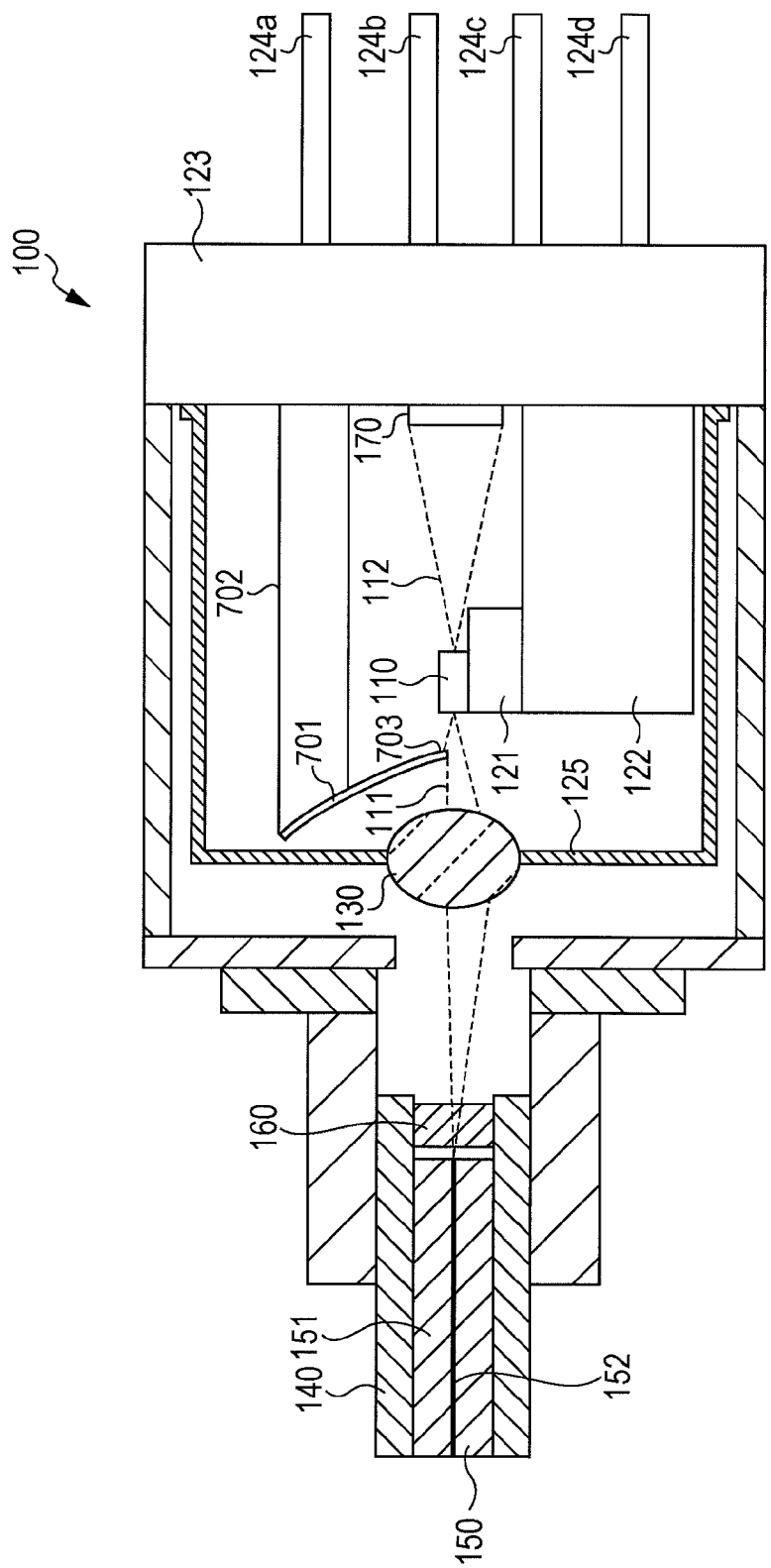
FIG. 7B is a diagram illustrating an example of a change in a plate at low temperatures.

FIG. 7B is a diagram illustrating an example of a change in the plate 701 at low temperatures. In FIG. 7B, the same reference numerals are given to the same components as those illustrated in FIG. 7A, and therefore description of those components is omitted. For example, at low temperatures (for example, −40° C.), the plate 701 bends toward the forward output light 111 and blocks part of the forward output light 111, as illustrated in FIG. 7B.

As illustrated in FIG. 7B, when the plate 701 blocks part of the forward output light 111, the angle of the plate 701 may be adjusted such that a surface 703 of the plate 701 that blocks part of the forward output light 111 obliquely faces the propagation direction of the forward output light 111. In doing so, part of the forward output light 111 blocked by the plate 701 can avoid being reflected from the plate 701 back to the semiconductor laser chip 110. Accordingly, it is possible to avoid changing the characteristics of the semiconductor laser chip 110 because of the reflected light, thereby avoiding increasing the noise.

Alternatively, the surface 703 of the plate 701 that blocks part of the forward output light 111 may be configured in such a way as not to reflect light. Part of the forward output light 111 blocked by the plate 701 can avoid being reflected from the plate 701 back to the semiconductor laser chip 110 by, for example, roughening the surface 703 through blasting or the like or by providing an anti-reflection film on the surface 703. Therefore, it is possible to avoid changing the characteristics of the semiconductor laser chip 110 because of the reflected light, thereby avoiding increasing the noise.

Figure 7C:
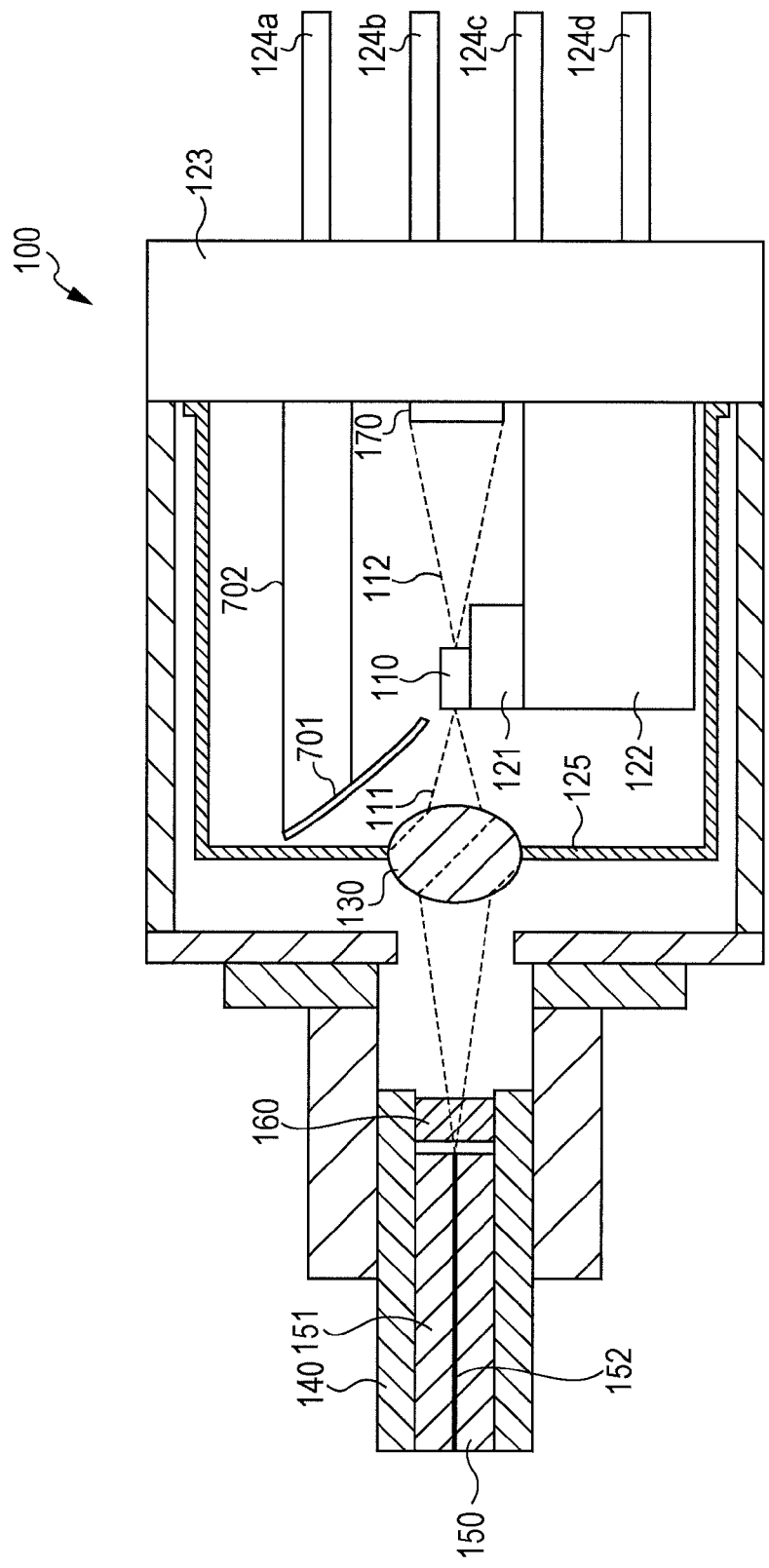
FIG. 7C is a diagram illustrating an example of a change in the plate at high temperatures.

FIG. 7C is a diagram illustrating an example of a change in the plate 701 at high temperatures. In FIG. 7C, the same reference numerals are given to the same components as those illustrated in FIG. 7A, and therefore description of those components is omitted. For example, at high temperatures (for example, 85° C.), the plate 701 bends toward the opposite side of the forward output light 111 and does not block the forward output light 111, as illustrated in FIG. 7C. Therefore, no loss is generated in the forward output light 111 by the plate 701.

As illustrated in FIGS. 7A to 7C, by using the plate 701 whose amount of bending changes in accordance with the temperature, the amount of loss of the forward output light 111 can be increased as the temperature decreases, as with the optical isolator 160 according to the first embodiment. Therefore, the same characteristics as the optical output characteristic 211 and the pulse mask characteristic 221 illustrated in FIG. 2C can be obtained.

Therefore, even when the emission power of the semiconductor laser chip 110 increases at low temperatures, excessive output power of the optical transmitter 100 can be avoided. For example, before the operation of the optical transmitter 100, the optical output power of the optical transmitter 100 is monitored while changing the temperature of the semiconductor laser chip 110, and the plate 701 is adjusted such that the optical output power remains substantially the same regardless of the temperature. Therefore, the optical output power of the optical transmitter 100 can be set to remain substantially the same regardless of the temperature.

As described above, in the optical transmitter 100 according to the second embodiment, the plate 701 with which the amount of light blocked thereby increases as the temperature decreases is provided in the subsequent stage of the semiconductor laser chip 110 whose power for emitting light increases as the temperature decreases. Therefore, even when the driving current is not decreased at low temperatures, an increase in the optical output power of the optical transmitter 100 can be suppressed.

Since the driving current is not decreased, a decrease in the relaxation oscillation frequency of the semiconductor laser chip 110 can be suppressed, thereby suppressing deterioration of the waveform of the light output from the optical transmitter 100. In addition, even when the driving current is decreased, an increase in the optical output power of the optical transmitter 100 can be suppressed with a small decrease, thereby suppressing deterioration of the waveform of the light output from the optical transmitter 100. In addition, by suppressing an increase in the optical output power of the optical transmitter 100, the optical output power of the optical transmitter 100 can avoid deviating from the optical output standard. Therefore, the quality of communication can be improved even at low temperatures. For this reason, for example, the operating temperature range of the optical transmitter 100 can be expanded.

For example, even when the driving current of the semiconductor laser chip 110 is controlled such that the pulse mask characteristic does not become lower than the threshold and therefore the driving current becomes large at low temperatures, an increase in the optical output power of the optical transmitter 100 can be suppressed. In addition, when the driving current is supplied to the semiconductor laser chip 110, too, an increase in the optical output power of the optical transmitter 100 can be suppressed.

According to the optical transmitter 100, by using the plate 701 having a characteristic that the amount of light blocked thereby increases as the temperature decreases, the operating temperature range can be expanded without a heater or the like. Therefore, increases in power consumption and the complexity of control can be avoided. In addition, for example, compared to a configuration in which a VOA is provided and the VOA is controlled in accordance with the temperature, increases in power consumption and the complexity of control can be avoided. In addition, the optical transmitter 100 according to the second embodiment may be applied, for example, to the TOSA 520 illustrated in FIG. 5.

Third Embodiment

Figure 8:
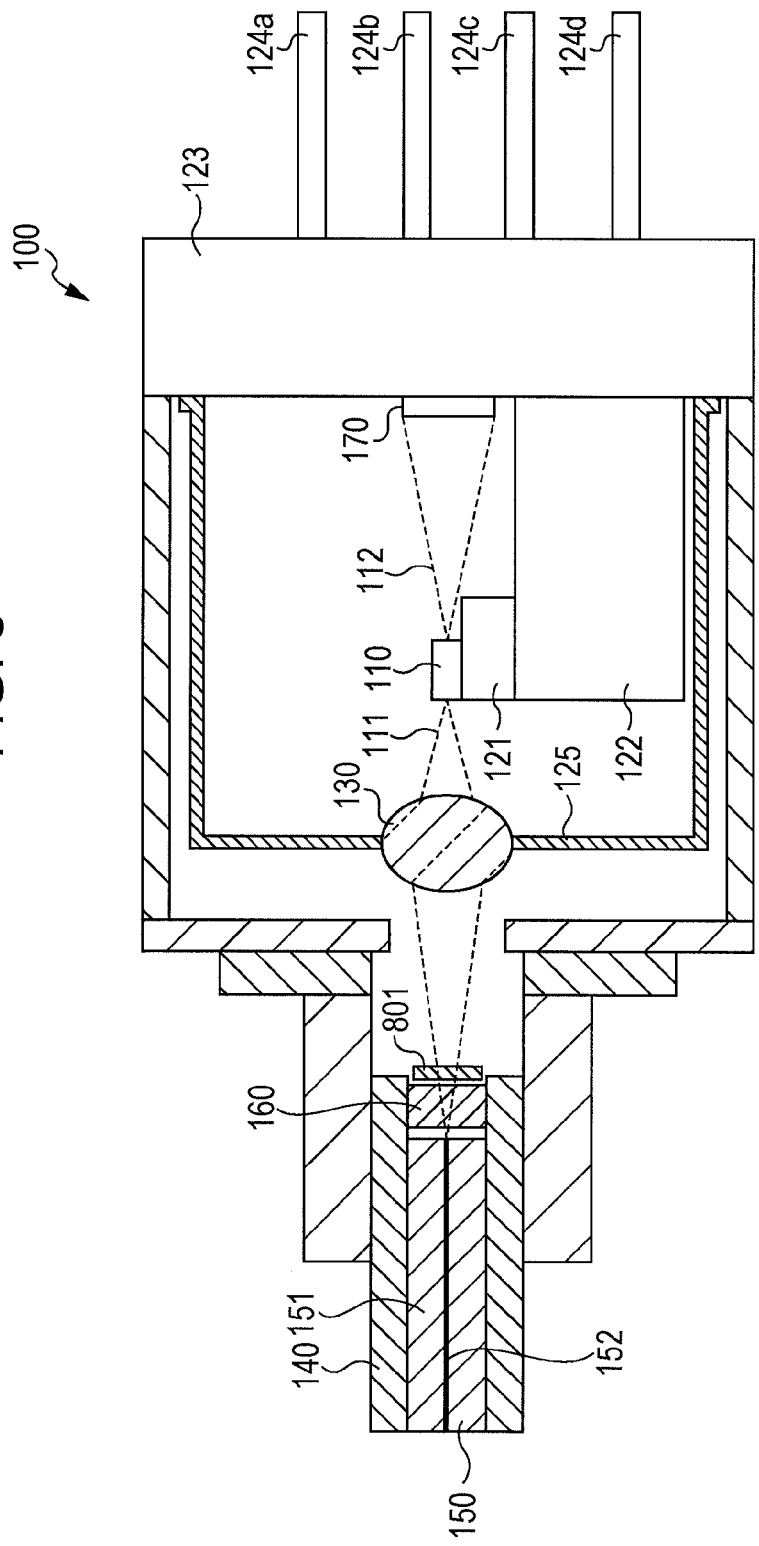
FIG. 8 is a cross-sectional view illustrating an example of the configuration of an optical transmitter according to a third embodiment.

FIG. 8 is a cross-sectional view illustrating an example of the configuration of an optical transmitter according to a third embodiment. In FIG. 8, the same reference numerals are given to the same components as those illustrated in FIG. 1, and therefore description of those components is omitted. As illustrated in FIG. 8, an optical transmitter 100 according to the third embodiment has an optical filter 801 in addition to the configuration illustrated in FIG. 1. The semiconductor laser chip 110 has a characteristic that the wavelength (oscillation wavelength) of the light emitted therefrom becomes shorter as the temperature decreases. For example, the semiconductor laser chip 110 has a temperature characteristic of about 0.1 nm/° C.

The optical filter 801 has a transmission characteristic that the transmittance for relatively short wavelengths is smaller than the transmittance for relatively long wavelengths. For example, the optical filter 801 has a transmission characteristic that the transmittance becomes lower as the wavelength becomes shorter on the low temperature side of the operating temperature range of the optical transmitter 100. The optical filter 801 is provided between the semiconductor laser chip 110 and the optical fiber stub 150 (output unit), and lets the light emitted from the semiconductor laser chip 110 toward the optical fiber stub 150 pass therethrough. In the example illustrated in FIG. 8, the optical filter 801 is provided between the lens 130 and the optical isolator 160. The optical filter 801 is, for example, a long wavelength transmitting filter. For example, the optical filter 801 may be realized by a dielectric multilayer film.

In the third embodiment, the insertion loss characteristic 401 of the optical isolator 160 is not limited to a characteristic that the insertion loss of the optical isolator 160 increases as the temperature decreases. For example, the insertion loss characteristic 401 of the optical isolator 160 may be a characteristic that the insertion loss of the optical isolator 160 remains the same regardless of the temperature.

Figure 9:
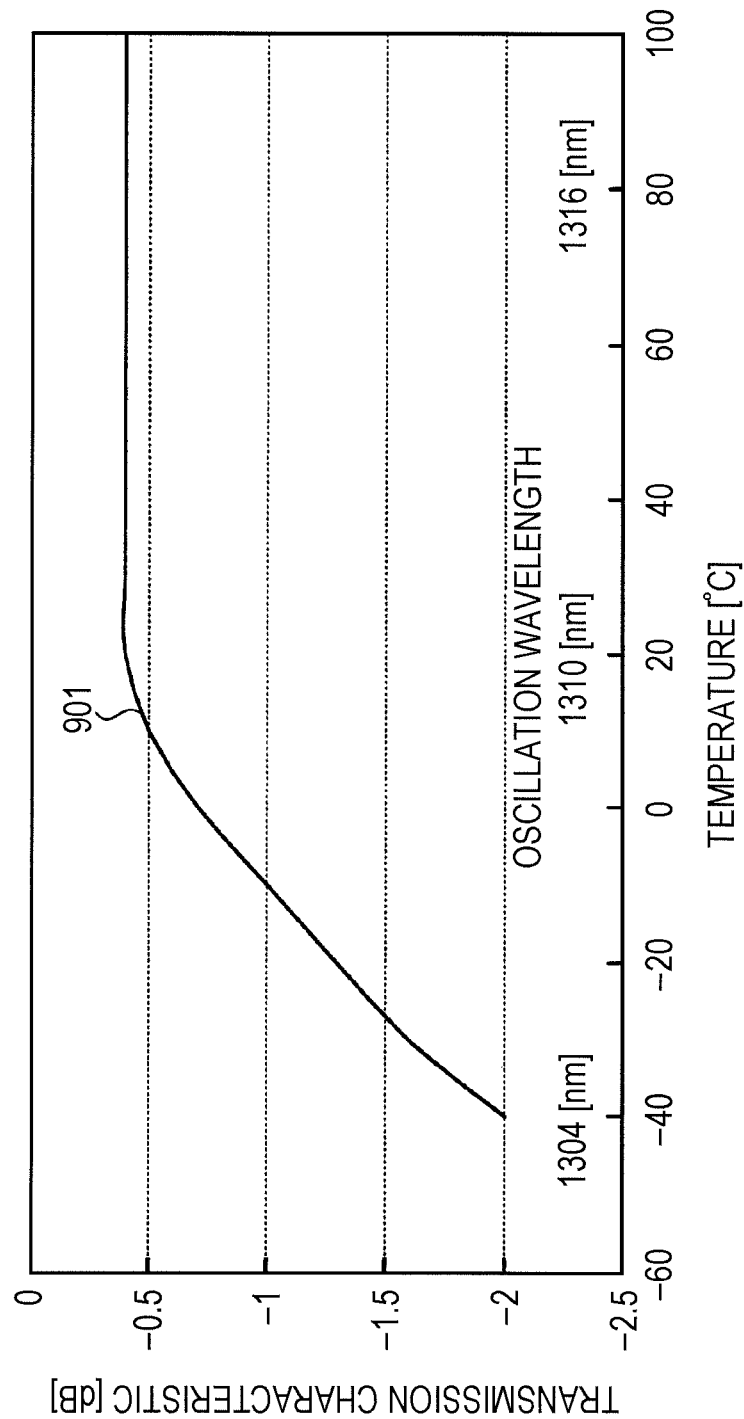
FIG. 9 is a diagram illustrating an example of the transmission characteristic of an optical filter.

FIG. 9 is a diagram illustrating an example of the transmission characteristic of the optical filter 801. In FIG. 9, the horizontal axis represents the temperature [° C.] and the oscillation wavelength [nm] of the semiconductor laser chip 110 associated with each other. For example, the oscillation wavelength of the semiconductor laser chip 110 is about 1310 nm at a temperature of 20° C. The vertical axis represents the transmission characteristic [dB] (transmittance) of the optical filter 801.

A filter characteristic 901 indicates the transmission characteristic of the optical filter 801 in relation to the wavelength. As illustrated by the filter characteristic 901, the transmittance of the optical filter 801 decreases as the wavelength becomes shorter on the short wavelength side (for example, 1304 to 1310 nm) of wavelengths to be used. The oscillation wavelength of the semiconductor laser chip 110 becomes shorter as the temperature decreases.

Therefore, by providing the optical filter 801, the amount of loss of the forward output light 111 can be increased as the temperature decreases, as with the optical isolator 160 according to the first embodiment. Accordingly, the same characteristics as the optical output characteristic 211 and the pulse mask characteristic 221 illustrated in FIG. 2C can be obtained. Therefore, even when the emission power of the semiconductor laser chip 110 increases at low temperatures, excessive output power of the optical transmitter 100 can be avoided.

As described above, the optical transmitter 100 according to the third embodiment, the optical filter 801 having a transmission characteristic that the transmittance for relatively short wavelengths is smaller than the transmittance for relatively long wavelengths is provided in the subsequent stage of the semiconductor laser chip 110. Therefore, even when the driving current is not decreased at low temperatures, an increase in the optical output power of the optical transmitter 100 can be suppressed.

Since the driving current is not decreased, a decrease in the relaxation oscillation frequency of the semiconductor laser chip 110 can be suppressed, thereby suppressing deterioration of the waveform of the light output from the optical transmitter 100. Even when the driving current is decreased, an increase in the optical output power of the optical transmitter 100 can be suppressed with a small decrease, thereby suppressing deterioration of the waveform of the light output from the optical transmitter 100. In addition, by suppressing an increase in the optical output power of the optical transmitter 100, the optical output power of the optical transmitter 100 can avoid deviating from the optical output standard. Therefore, the quality of communication can be improved even at low temperatures. For this reason, for example, the operating temperature range of the optical transmitter 100 can be expanded.

For example, even when the driving current of the semiconductor laser chip 110 is controlled such that the pulse mask characteristic does not become lower than the threshold and therefore the driving current becomes large at low temperatures, an increase in the optical output power of the optical transmitter 100 can be suppressed. In addition, when the driving current is supplied to the semiconductor laser chip 110, too, an increase in the optical output power of the optical transmitter 100 can be suppressed.

According to the optical transmitter 100, by using the optical filter 801 having a transmission characteristic that the transmittance for relatively short wavelengths is smaller than the transmittance for relatively long wavelengths, the operating temperature range can be expanded without a heater or the like. Therefore, increases in power consumption and the complexity of control can be avoided. In addition, for example, compared to a configuration in which a VOA is provided and the VOA is controlled in accordance with the temperature, increases in power consumption and the complexity of control can be avoided. In addition, the optical transmitter 100 according to the third embodiment may be applied, for example, to the TOSA 520 illustrated in FIG. 5.

As described above, according to the optical transmitter and the optical transmission apparatus, the quality of communication can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

Additional note. The following additional notes are disclosed with respect to the above embodiments.

<11>. An optical transmission apparatus, comprising:
  a laser configured to emit light, a power of the light increasing with temperature decreasing;
  an output port configured to output the light emitted from the laser;
  a plate whose amount of bending changes in accordance with the temperature and that blocks part of the light emitted from the laser toward the output port in accordance with the amount of bending, an amount of light blocked by the plate increasing as the temperature decreases;

a measuring device configured to measure temperature of the laser;

a memory configured to store association information obtained by associating the temperature measured by the measuring device with a value of a driving current with which quality of a waveform of the light output by the output port satisfies a certain condition; and a driver configured to drive the laser using the driving current having a value based on the temperature measured by the measuring device and the association information stored by the memory.

<12>. An optical transmitter, comprising:

a laser that emits light of which a power increases as temperature decreases, a wavelength of the light decreasing as the temperature decreases;

an optical filter configured to have a transmission characteristic that transmittance for relatively short wavelengths is smaller than transmittance for relatively long wavelengths and let the light emitted from the laser pass through the optical filter; and an output port configured to output the light that has passed through the optical filter.

<13>. An optical transmission apparatus, comprising:

a laser that emits light of which a power increases as temperature decreases, a wavelength of the light decreasing as the temperature decreases;

an optical filter configured to have a transmission characteristic that transmittance for relatively short wavelengths is smaller than transmittance for relatively long wavelengths and let the light emitted from the laser pass through the optical filter;

an output port configured to output the light that has passed through the optical filter;

a measuring device configured to measure temperature of the laser;

a memory configured to store association information obtained by associating the temperature measured by the measuring device with a value of a driving current with which quality of a waveform of the light output by the output port satisfies a certain condition; and a driver configured to drive the laser using the driving current having a value based on the temperature measured by the measuring device and the association information stored by the memory.

What is claimed is:

1. An optical transmitter, comprising:

a laser configured to emit light, a power of the light increasing with temperature decreasing;

a Faraday rotator configured to rotate a polarization direction of the light, based on the temperature; and a first polarizer that has a principal axis inclined at a given angle and inputs the light output from the Faraday rotator, wherein a difference between a rotational angle of the Faraday rotator in the polarization direction and the given angle increases as the temperature decreases.

2. The optical transmitter according to claim 1, further comprising:

an optical attenuator configured to include a second polarizer that passes linearly polarized light in a given direction in the light emitted from the laser.

3. The optical transmitter according to claim 1, further comprising:

a lens configured to be provided such that the laser and an optical fiber are optically coupled with each other through the optical attenuator.

4. The optical transmitter according to claim 2, wherein the optical attenuator includes a plurality of optical attenuators arranged in series with one another.

* * * * *